US009905985B2

(12) United States Patent
Darr et al.

(10) Patent No.: US 9,905,985 B2
(45) Date of Patent: Feb. 27, 2018

(54) OPTIMIZED HIGH CURRENT CONNECTOR PATTERN FOR PDB

(71) Applicant: LEAR CORPORATION, Southfield, MI (US)

(72) Inventors: Christopher Darr, Livonia, MI (US); Peter Kowtun, Plymouth, MI (US); Dennis Pajtas, Hartland, MI (US); Bruce Pierik, Hazel Park, MI (US); Kent Nelson, Southfield, MI (US); Steven Gawron, Plymouth, MI (US)

(73) Assignee: Lear Corporation, Southfield, MI (US)

( * ) Notice: Subject to any disclaimer, the term of this patent is extended or adjusted under 35 U.S.C. 154(b) by 184 days.

(21) Appl. No.: 14/740,923

(22) Filed: Jun. 16, 2015

(65) Prior Publication Data

US 2016/0372898 A1 Dec. 22, 2016

(51) Int. Cl.
*G06F 17/50* (2006.01)
*H01R 43/20* (2006.01)
*H05K 1/18* (2006.01)
*H02B 1/056* (2006.01)

(52) U.S. Cl.
CPC ............ *H01R 43/205* (2013.01); *H05K 1/18* (2013.01); *H02B 1/056* (2013.01); *H05K 2201/10181* (2013.01); *H05K 2201/10522* (2013.01)

(58) Field of Classification Search
CPC ........ H01R 43/205; H02B 1/32; H02B 1/056; H05K 5/0069; H05K 1/18; H05K 2201/10181; H05K 2201/10522
See application file for complete search history.

(56) References Cited

U.S. PATENT DOCUMENTS

| 5,715,135 | A | 2/1998 | Brussalis et al. |
| 6,232,675 | B1 * | 5/2001 | Small ............... H01H 47/001 307/30 |
| 6,434,009 | B1 | 8/2002 | Culp |
| 6,468,091 | B2 | 10/2002 | Roussel et al. |
| 6,739,889 | B1 | 5/2004 | Daggett et al. |
| 8,348,679 | B2 | 1/2013 | Lee et al. |
| 8,723,033 | B2 | 5/2014 | Hara et al. |
| 2001/0000427 | A1 * | 4/2001 | Miller ............... H01L 23/5227 333/33 |
| 2003/0074638 | A1 * | 4/2003 | Osaka ............... G06F 17/5036 716/102 |

(Continued)

*Primary Examiner* — Vuthe Siek
(74) *Attorney, Agent, or Firm* — Fishman Stewart PLLC

(57) ABSTRACT

A power distribution box assembly may include a housing, a circuit board disposed in the housing, a plurality of electrical components attached to the circuit board, and/or a plurality of electrical traces attached to the circuit board and configured for electrically connecting the plurality of electrical components to at least one of another electrical component of the plurality of electrical components and an electronic control unit. A power distribution box assembly may include a wiring harness connector connected to the housing. In embodiments, a wiring harness connector may include a connector housing and a plurality of connector terminals that may be configured for electrical connection with the plurality of electrical components. A plurality of electrical components may be disposed relative to the circuit board in a manner that minimizes at least one of a number, a length, and a volume of the electrical traces.

20 Claims, 13 Drawing Sheets

(56) References Cited

U.S. PATENT DOCUMENTS

| | | | |
|---|---|---|---|
| 2004/0005820 A1* | 1/2004 | Gutierrez | H01R 13/7172 439/676 |
| 2010/0144172 A1* | 6/2010 | Pavlovic | H01R 13/514 439/78 |
| 2014/0232289 A1* | 8/2014 | Brandes | H05B 33/086 315/250 |
| 2016/0126706 A1* | 5/2016 | Melchor Saucedo | B60R 16/0238 361/626 |

\* cited by examiner

OPTIMIZED HIGH CURRENT CONNECTOR PATTERN FOR PDB

TECHNICAL FIELD

The present disclosure relates to electrical connectors, including electrical connectors used for connecting wiring harnesses with power distribution boxes.

BACKGROUND

Conventional power distribution boxes may include circuit boards with electrical components attached thereto. Typically, the arrangement of the electrical components on the circuit board may be dictated by an arrangement of electrical terminals of a wiring harness electrical connector that connects to the power distribution box. This may result in a less than an efficient or optimized design with some circuit boards.

SUMMARY

The present disclosure includes a connector and a power distribution box assembly. In embodiments, a power distribution box assembly may comprise a housing, a circuit board disposed in the housing, a plurality of electrical components attached to the circuit board, and/or a plurality of electrical traces attached to the circuit board. Electrical traces may be configured for electrically connecting the plurality of electrical components to at least one of (i) another electrical component of the plurality of electrical components and (ii) an electronic control unit (ECU). In embodiments, a power distribution box assembly may comprise a wiring harness connector connected to and/or configured for connection with the housing and/or the electrical components. In embodiments, a wiring harness connector may include a connector housing and/or a plurality of connector terminals that may be configured for electrical connection with the plurality of electrical components. In embodiments, the plurality of electrical components may be disposed relative to the circuit board in a manner that minimizes a total amount of the electrical traces.

In embodiments, a method of manufacturing an electrical connector may comprise determining a circuit board layout that minimizes a total amount of electrical traces that electrically connect a plurality of electrical components; designing a layout for terminals of the electrical connector according to the determined circuit board layout; and/or manufacturing the electrical connector according to the designed layout.

Various aspects of this disclosure will become apparent to those skilled in the art from the following detailed description of an embodiment of the present disclosure, when read in light of the accompanying drawings.

DETAILED DESCRIPTION

Figure 1A:
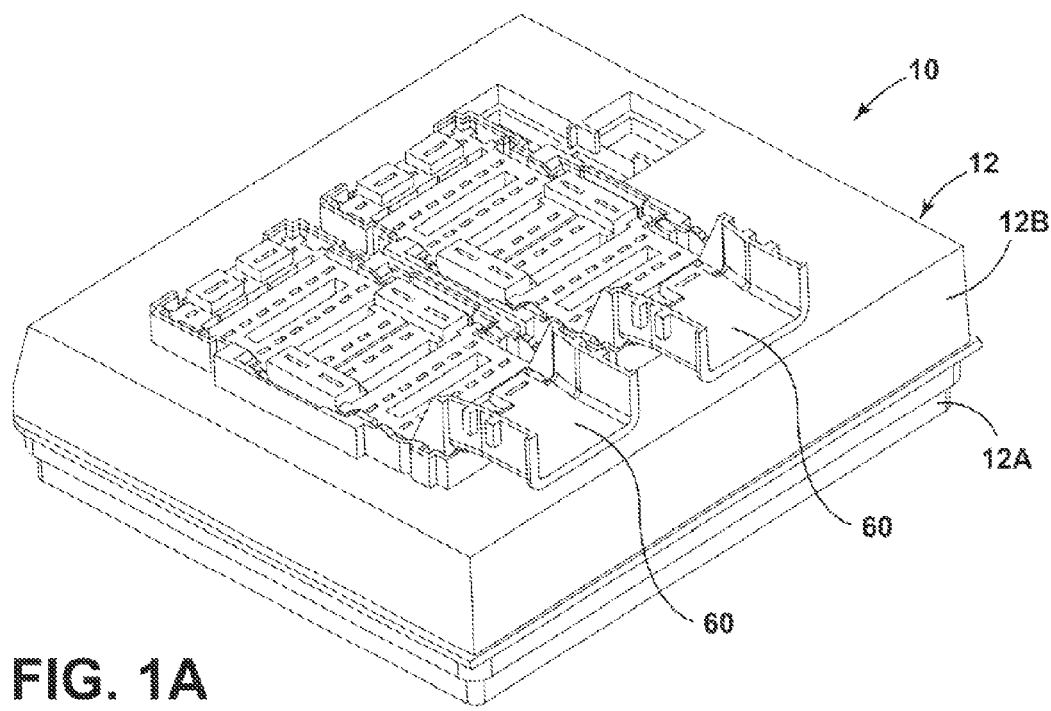
FIGS. 1A-1C are perspective views of portions of an embodiment of a power distribution box in accordance with teachings of the present disclosure.
Figure 1B:
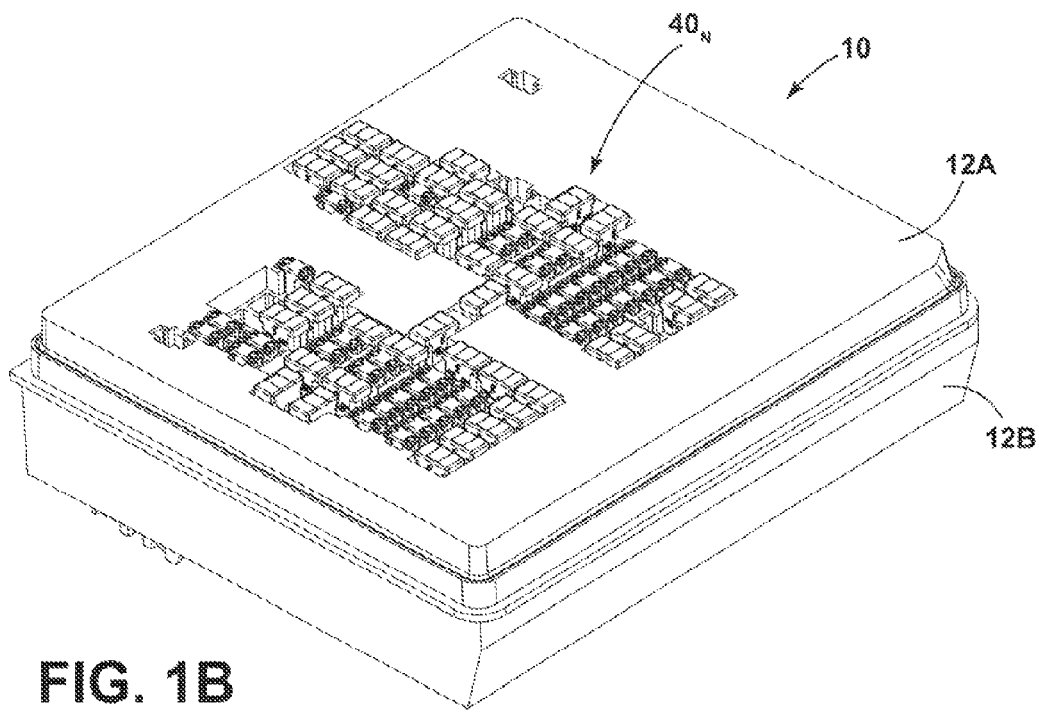
Figure 1C:
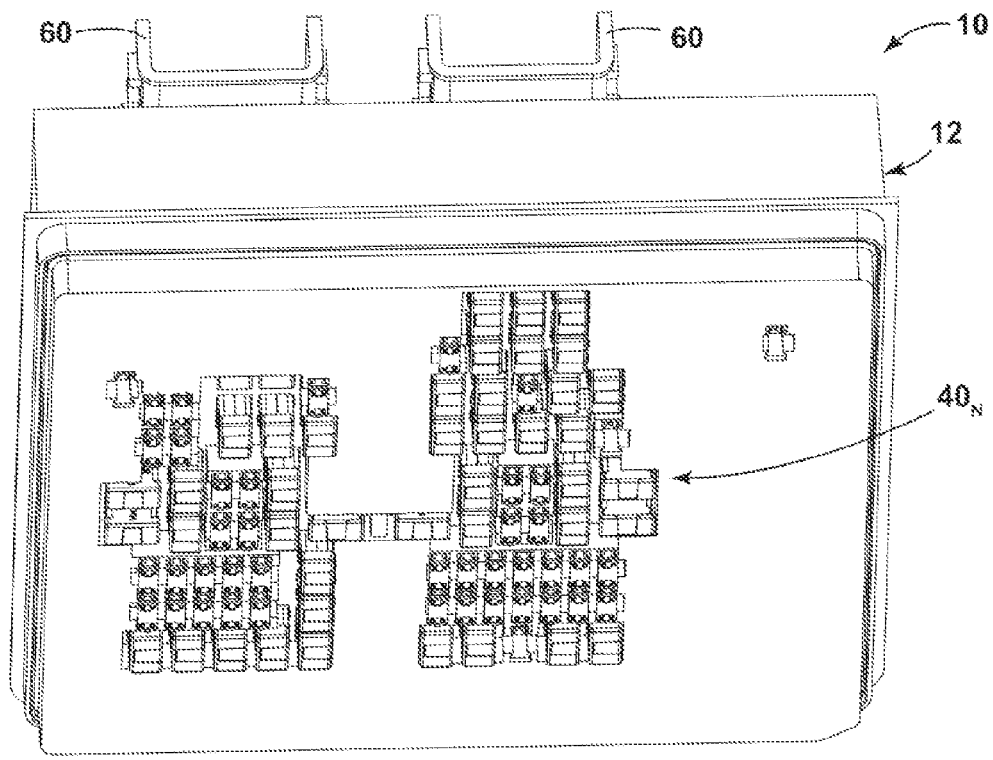
Figure 1D:
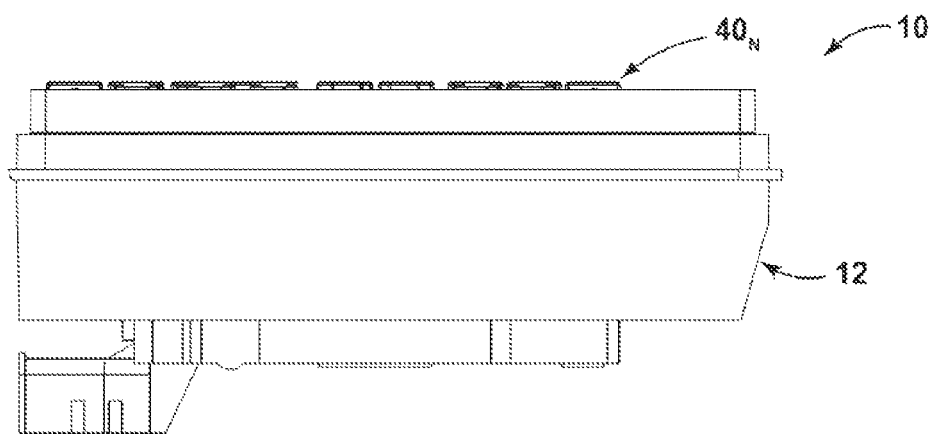
FIGS. 1D and 1E are side views of portions of an embodiment of a power distribution box in accordance with teachings of the present disclosure.
Figure 1E:
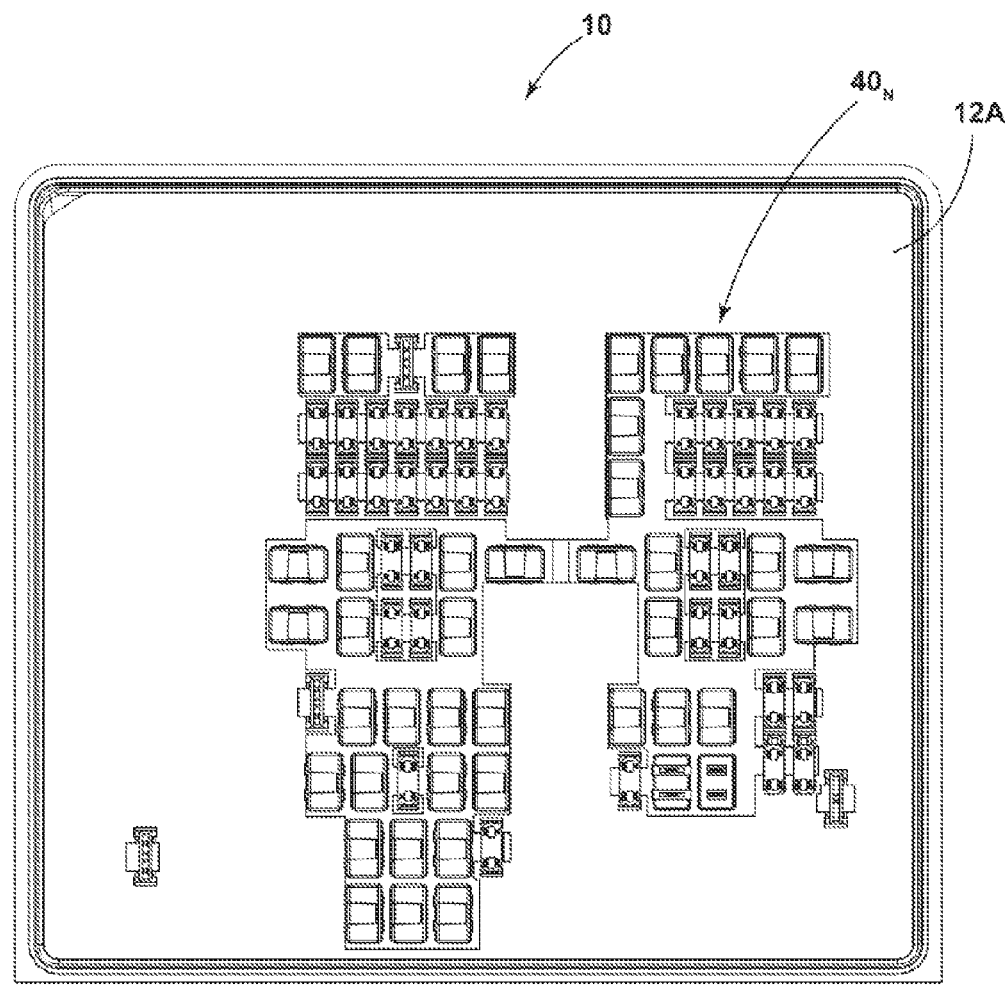

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by appended claims.

Referring to the drawings FIGS. 1A-1E generally illustrate an embodiment of a power distribution box (PDB) 10 that may be configured for high current (for example, up and/or exceeding 60 amps) applications. Power distribution box 10 may include a housing 12 and/or may be used to support a plurality of electrical components $40_N$, such as, for example only, electrical components within a portion of a vehicle. Housing 12 may include a first portion 12A and/or a second portion 12B. It should be appreciated, however, that power distribution box 10 may be used in any appropriate environment and for any suitable purpose.

In embodiments, such as generally illustrated in FIGS. 1A-3, PDB 10 may include a circuit board 20 and/or one or more electrical components $40_N$. In embodiments, circuit board 20 may comprise a printed circuit board (PCB). In embodiments, electrical components $40_N$ may be attaches and/or electrically connected to circuit board 20.

In embodiments, an electrical component $40_N$ may include one or more of fuses, relays, and/or other electrical components. In embodiments, one or more of electrical components $40_N$ may include one or more terminals (e.g., terminals $42_N$, $44_N$). Terminals $42_N$, $44_N$ may be configured for electrically connecting an electrical component $40_N$ to circuit board 20, to another electrical component $40_N$, and/or to an electrical connector 60. Electrical connector 60 may be referred to herein as wiring harness connector 60, but is not limited to a wiring harness connector.

Figure 8:
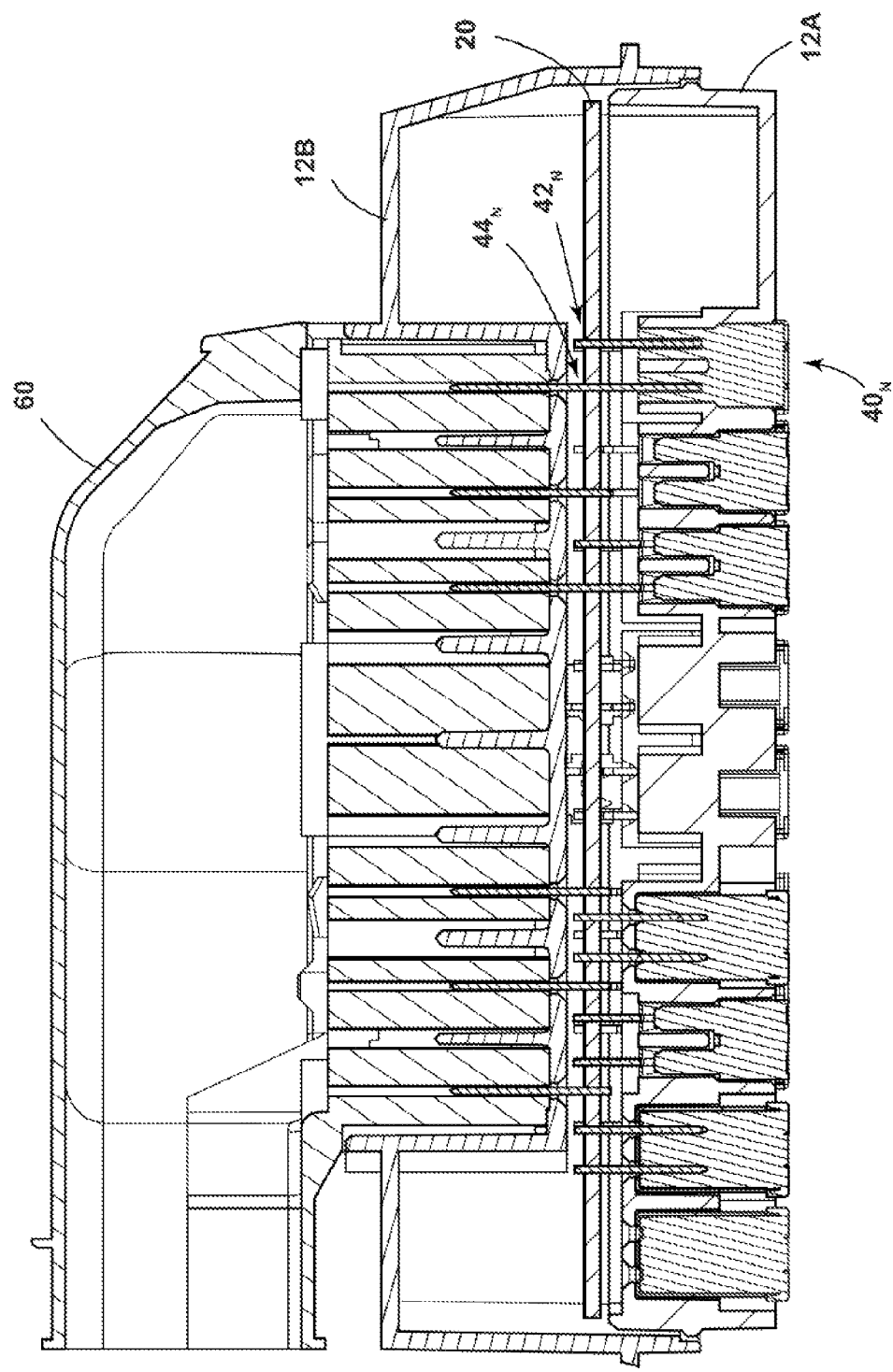
FIG. 8 is a cross-sectional view of a portion of an embodiment of a power distribution box and a wiring harness connector in accordance with teachings of the present disclosure.

In embodiments, electrical components $40_N$ may include a first terminal $42_N$ and/or a second terminal $44_N$. In embodiments, first terminals $42_N$ may be configured to contact circuit board 20 (e.g., make an electrical connection with an electrical trace 50), but may not extend through circuit board 20 and/or may not directly connect with electrical connector 60 (see also, e.g., FIG. 8).

In embodiments, a second terminal $44_N$ of an electrical component $40_N$ may or may not include a substantially similar configuration (e.g., length, width, thickness, etc.) as the first terminal $42_N$ of the electrical component $40_N$. Second terminals $44_N$ may be configured for insertion into and/or through circuit board 20, which may include having widths $44A_N$ that may correspond to a corresponding aperture $22_N$ in circuit board. For example, and without limitation, width $44A_1$ of a second terminal $44_1$ may be about the same as corresponding aperture $22_1$ and/or second terminal $44_1$ may be press fit into corresponding aperture $22_1$. In embodiments, second terminal $44_1$ may be configured to extend through circuit board 20 and/or to connect directly to electrical connector 60. For example, and without limitation, some or all of second terminals $44_N$ may be longer than first terminals $42_N$ such that first terminals $42_N$ extend through circuit board 20 sufficiently far to be soldered to circuit board 20 while second terminals 44 extend through circuit board 20 and into electric connector 60 (e.g., first terminal $42_1$ may be shorter than second terminal $44_1$ of electrical component $40_1$).

Figure 3:
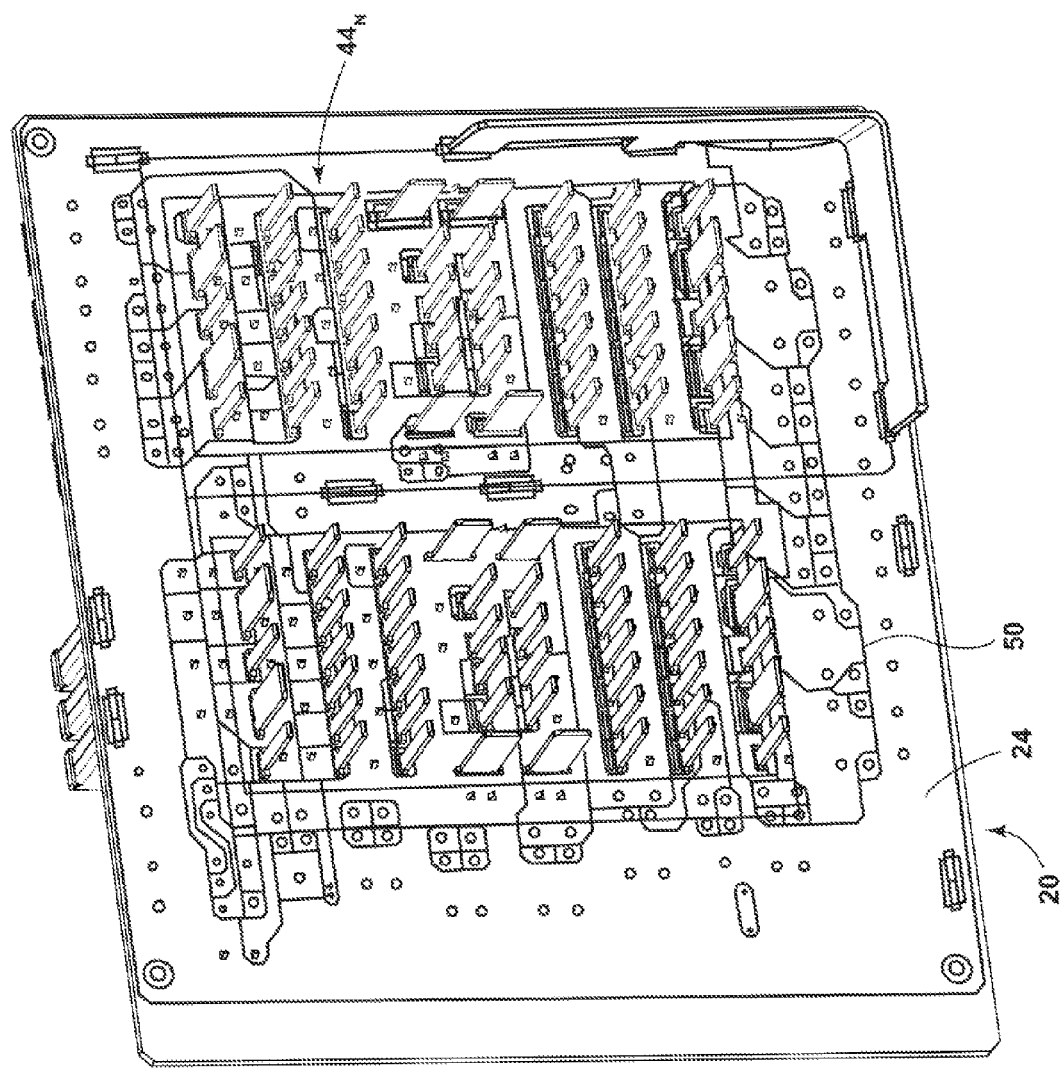
FIG. 3 is a perspective view of a portion of an embodiment of a circuit board assembly of a power distribution box in accordance with teachings of the present disclosure.
Figure 4B:
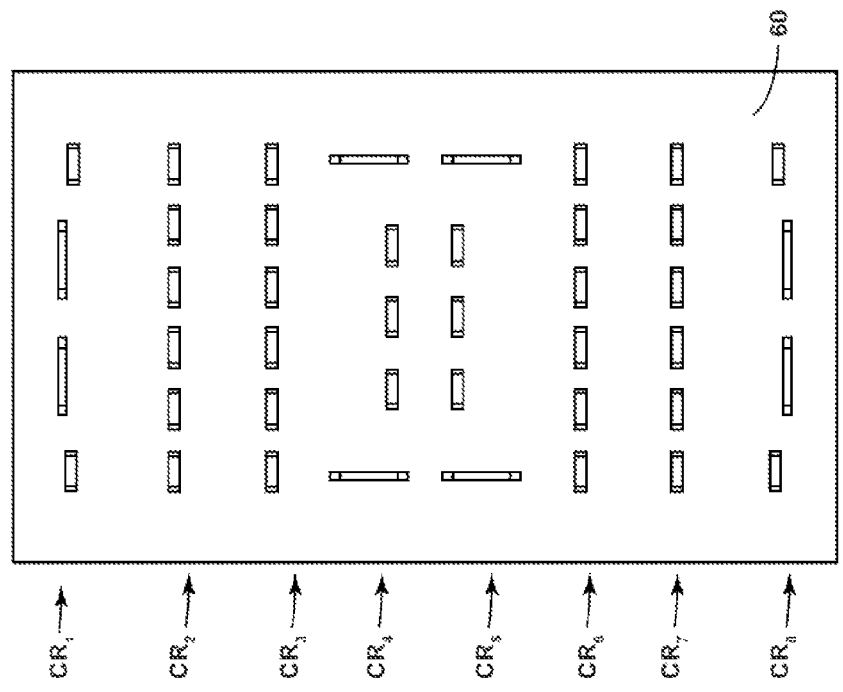
FIG. 4B is a bottom view of a portion of an embodiment of a wiring harness connector in accordance with teachings of the present disclosure.
Figure 4A:
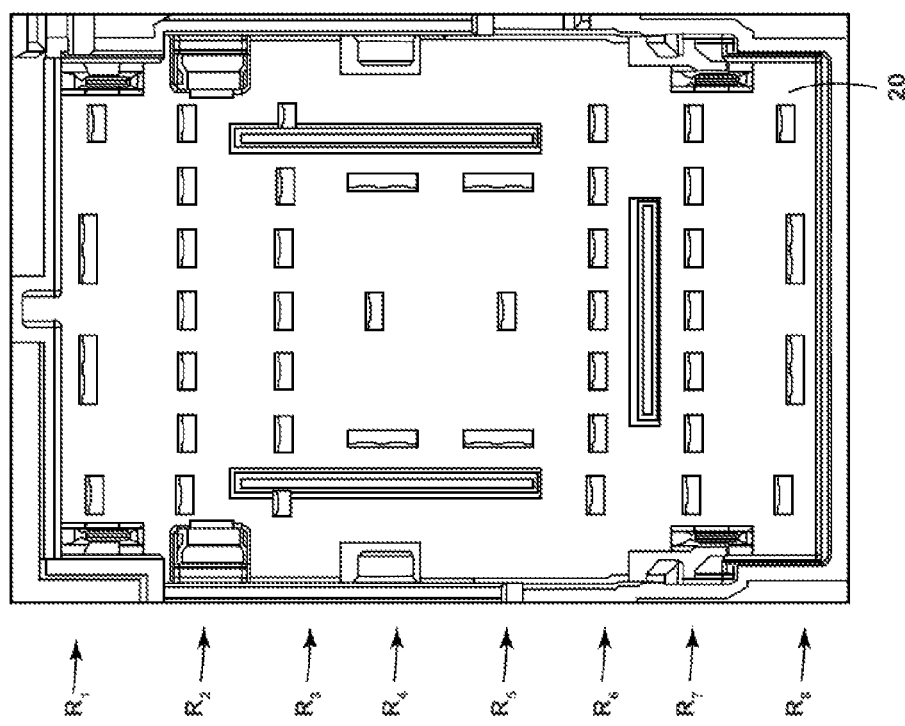
FIG. 4A is a bottom view of a portion of an embodiment of a power distribution box in accordance with teachings of the present disclosure.
Figure 5:
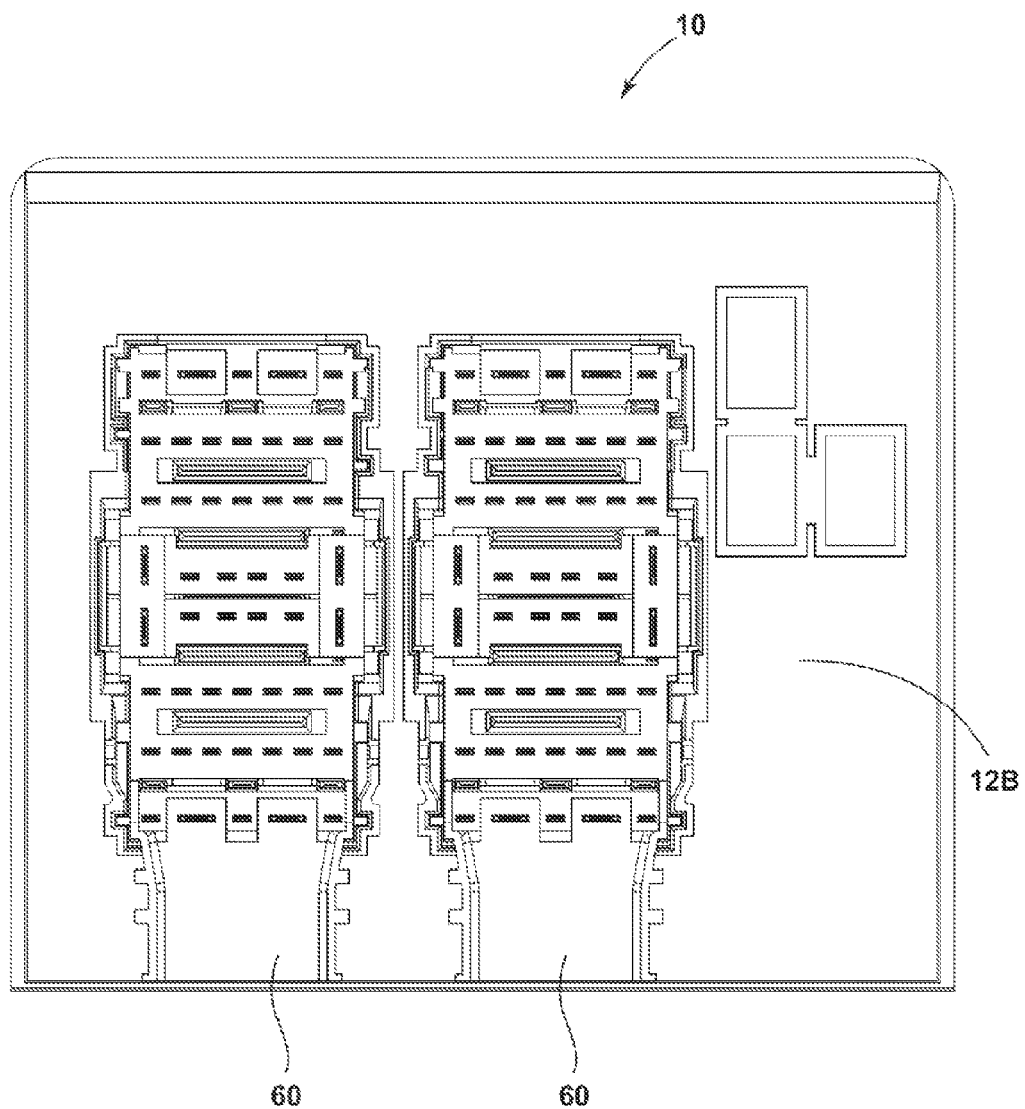
FIG. 5 is a top view of a portion of an embodiment of a power distribution box in accordance with teachings of the present disclosure.
Figure 6:
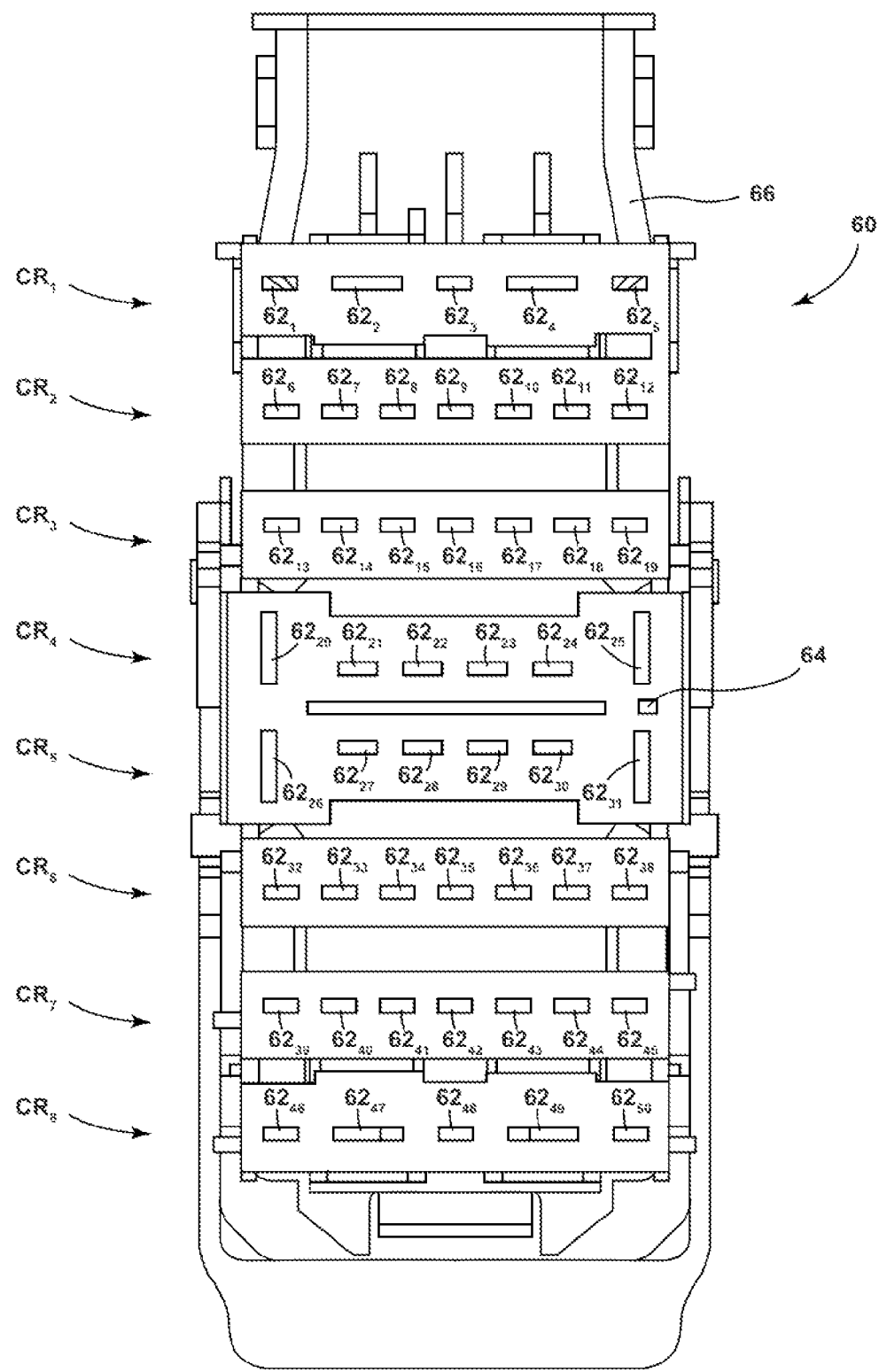
FIG. 6 is a bottom view of a portion of an embodiment of a wiring harness connector in accordance with teachings of the present disclosure.
Figure 7:
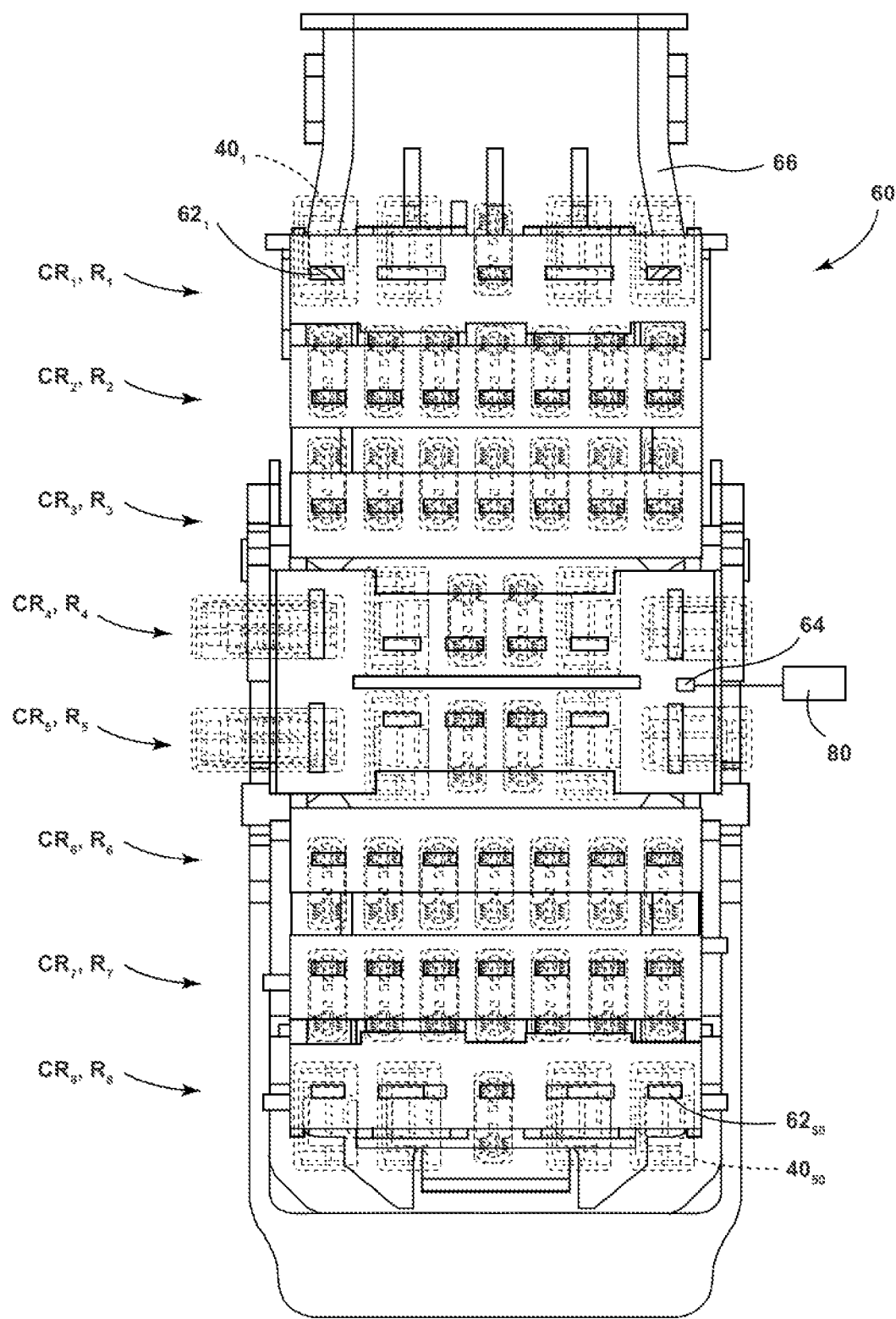
FIG. 7 is a superimposed view of a portion of an embodiment of a wiring harness connector and electrical components in accordance with teachings of the present disclosure.

In embodiments, such as generally illustrated in FIG. 3, electrical traces 50 may be connected to and/or disposed on circuit board 20. Electrical traces 50 may electrically connect electrical components $40_N$, which may be attached to circuit board 20, to each other and/or to other electrical components that may not be attached to circuit board 20. For example, and without limitation, electrical components $40_N$ attached to circuit board 20 may be electrically connected to an electronic control unit (ECU) 70, which may or may not be physically connected or attached to circuit board 20, via electrical traces 50.

In embodiments, it may be desirable to minimize a total amount (e.g., number, length, volume, etc.) of electrical traces 50 on a circuit board 20. A reduced amount of electrical traces 50 may, in some instances, reduce the complexity and/or cost of manufacturing circuit board 20 and/or PDB 10. In embodiments, minimizing a total amount of electrical traces 50 may include determining an arrangement/layout of electrical components $40_N$ on circuit board 20 that minimizes electrical traces 50. In embodiments, a minimized arrangement may include the smallest length, volume, and/or number of traces that still provides desired electrical connections between electrical components $40_N$. Determining an minimized arrangement may include determining a desired set of electrical components $40_N$ for attaching to circuit board 20 and/or for connecting to a wiring harness connector 60. A desired set of electrical components $40_N$ may include, among other things, fuses and/or relays that may have one or more of a variety shapes, sizes, configurations, and/or electrical characteristics (e.g., current ratings). For example, and without limitation, fuses may include current ratings from 5 amps to 60 amps.

In embodiments, determining a trace minimizing arrangement may, additionally or alternatively, include determining a surface area (e.g., a maximum surface area) of a face/side 24 of circuit board 20 to which electrical components $40_N$ of the desired set may be connected or attached. A minimizing arrangement may be determined according to the desired set of desired electrical components $40_N$ and the surface area of circuit board 20, and/or a list of desired electrical connections. A list of intended or desired connections may specify how electrical components $40_N$ should be connected (e.g., to which other electrical component(s) $40_N$). For example, and without limitation, electrical components $40_N$ of the desired set may be iteratively arranged relative to the determined surface area and the list of desired electrical connections, and the iteration/arrangement with the lowest total amount of electrical traces 50 may be designated as the minimizing arrangement. In embodiments, iteratively arranging the electrical components $40_N$ may be conducted via a simulation, such as a computer simulation. A simulation may include models of circuit board 20, electrical components $40_N$, electrical traces 50, and/or electrical connector 60. A computer simulation may be configured to automatically iterate through all possible arrangements, compare the total amount of electrical traces 50 from each arrangement, and/or select a preferred or optimized arrangement (e.g., the arrangement with the lowest total amount of electrical traces 50).

In embodiments, one or more of electrical terminals $40_N$ may include a long side/dimension $40A_N$ and a short side/dimension $40B_N$. Long side $40A_N$ may be the longest side of an electrical terminal $40_N$ and short side $40B_N$ may be the shortest side of an electrical terminal $40_N$. As generally illustrated in FIG. 2C, circuit board 20 may include long edges 26A, 26B and short edges 28A, 28B (e.g., the lengths of edges 26A, 26B may be longer than the lengths of edges 28A, 28B). In embodiments, a minimized tor optimized) arrangement may include a first set of electrical components $40_N$ (e.g., components $40_1$-$40_{19}$, $40_{21}$-$40_{24}$, $40_{27}$-$40_{30}$, $40_{32}$-$40_{50}$) and/or a second set of electrical components (e.g., components $40_{20}$, $40_{25}$, $40_{26}$, $40_{31}$). A minimized arrangement may include the first set of electrical components $40_N$ being, disposed such that the long side $40A_{20}$ of each electrical component of the first set is parallel with long edges 26A, 26B of circuit board 20. In embodiments, the second set of electrical components $40_N$ may include a long side $40A_N$ (e.g., long sides $40A_{20}$, $40A_{25}$, $40A_{26}$, $40A_{31}$) and a short side $40B_N$ (e.g., short sides $40B_{20}$, $40B_{25}$, $40B_{26}$, $40B_{31}$). A minimized arrangement may include the second set of electrical components $40_N$ being disposed such that the long side $40A_N$ of each electrical component of the second set is parallel with short edges 28A, 28B of circuit board 20 and/or perpendicular to long edges 26A, 26B of circuit board 20.

In embodiments, such as generally illustrated in FIGS. 1B-4A, a minimized arrangement may include disposing electrical components $40_N$ in a plurality of rows $R_N$ (e.g., rows $R_1$, $R_2$, $R_3$, $R_4$, $R_5$, $R_6$, $R_7$, $R_8$) and/or in a plurality of columns. In embodiments, a row of electrical components $40_N$ may include one or more electrical components $40_N$ from the first set and/or one or more electrical components from the second set (e.g., a row may include electrical components $40_N$ disposed perpendicularly to each other). For example, and without limitation, at least one of the plurality of rows $R_N$ may include at least two electrical components $40_N$ from the first set and at least two electrical components $40_N$ from the second set. In embodiments, each row $R_N$ or column may or may not include the same number of electrical components $40_N$. For example, and without limitation, a first group of rows $R_N$ may include a first number of electrical components (e.g., rows $R_2$, $R_3$, $R_6$, and $R_7$ may include seven electrical components, such as generally illustrated in FIGS. 1-5). In embodiments, a second group of rows $R_N$ may include a second number of electrical components $40_N$ that may be different than the first number (e.g., rows $R_1$ and $R_8$ may include five electrical components, such as generally illustrated in FIGS. 1-3). In embodiments, a minimized arrangement may include the first and second groups of rows $R_N$ with different numbers of electrical components in each group of rows $R_N$. In embodiments, such as generally illustrated in FIGS. 1B-4A, a minimized arrangement may include more than two groups of rows $R_N$ that each include the same number of electrical components. In embodiments, a minimized arrangement may include three or more groups, each row in a particular group may include the same number of electrical components, and/or rows from different groups may have different numbers of electrical components per row.

In embodiments, the plurality of rows $R_N$ may include at least eight rows (e.g., rows $R_1$-$R_8$). In embodiments, some rows (e.g., rows $R_1$ and $R_8$) may be disposed at opposite ends of circuit board 20. Some rows (e.g., rows $R_1$ and $R_8$) may include a plurality of large electrical components and/or a plurality of small electrical components. In embodiments, large electrical components may include time-delay fuses and/or fuses configured for temporary and/inrush current, such as, for example, MCASE™ fuses offered by Littelfuse, Inc. In embodiments, small electrical components may include, for example, micro fuses. In embodiments, small electrical components may be physically smaller (e.g., length, width, and/or height) than large electrical components. In embodiments, certain rows (e.g., rows $R_1$ and $R_8$) may each include a total of five electrical components. In embodiments, certain rows (e.g., row $R_1$) may include electrical components $40_1$-$40_5$, which may all be large electrical components. In embodiments, certain rows (e.g., row $R_8$) may include three small electrical components (e.g., components $40_{46}$, $40_{48}$, $40_{50}$) and two large electrical components (e.g., components $40_{47}$, $40_{49}$), and/or the electrical components $40_N$ may be disposed in an alternating pattern according to size (e.g., small, large, small, large, small). In embodiments, such as generally illustrated in FIG. 2B, an alternating pattern may include large electrical components (e.g., components $40_{47}$ and $40_{49}$) being disposed at relatively small distances from adjacent small electrical components (e.g., component 4046, 4048, and/or 4050). For example, and without limitation, a center-to-center distance 56 between components $40_{46}$ and $40_{47}$ (e.g., between respective center lines) may be about 8.30 mm or less.

In embodiments, a group of rows (e.g., rows $R_2$, $R_3$, $R_6$, and $R_7$) may be disposed between rows from a different group or different groups (e.g., between $R_1$ and $R_8$). Certain rows (e.g., rows $R_2$, $R_3$, $R_6$, and $R_7$) may each include a plurality of small electrical components (e.g., components $40_6$-$40_{19}$ and $40_{32}$-$40_{45}$) that may or may not be disposed at equal distances from each other. In embodiments, such as generally illustrated in FIG. 2B, certain small electrical components (e.g., two or more adjacent components of components $40_6$-$40_{19}$ and/or components $40_{32}$-$40_{45}$) may be disposed at a relatively small distance from each other. For example, and without limitation, a distance 52 between center lines of components $40_6$ and $40_7$ may be about 5.50 mm or less.

In embodiments, second terminals (e.g., terminals $44_6$, $44_7$, $44_8$, $44_9$, $44_{10}$, $44_{11}$, $44_{12}$) of electrical components in row $R_2$ may be disposed such that they face a corresponding first terminal (e.g., terminals $42_{13}$, $42_{14}$, $42_{15}$, $42_{16}$, $42_{17}$, $42_{18}$, $42_{19}$) of an electrical component in row $R_3$. In embodiments, first terminals of components in one or more of the rows $R_N$ may be disposed such that they are disposed outward of second terminals $44_N$, relative to the center of circuit board 20. In embodiments, second terminals $44_N$ (e.g., terminals $44_{32}$, $44_{33}$, $44_{34}$, $44_{35}$, $44_{36}$, $44_{37}$, $44_{38}$) of electrical components $40_N$ in certain rows (e.g., components $40_{32}$-$40_{38}$ of row $R_6$) may be disposed such that they face corresponding first terminals $42_N$ (e.g., terminals $42_{39}$, $42_{40}$, $42_{41}$, $42_{42}$, $42_{43}$, $42_{44}$, $42_{45}$) of electrical components in an adjacent row (e.g., components $40_{39}$-$40_{45}$ of row $R_7$). In embodiments, first terminals $42_N$ of components in certain rows (e.g., rows $R_6$ and $R_7$) may be disposed such that they are disposed outward of their respective second terminals $44_N$.

In embodiments, a group of rows (e.g., rows $R_4$ and $R_5$) may be disposed at or near the middle of circuit board 20, which may include being disposed in the middle of rows $R_2$, $R_3$, $R_6$, and $R_7$ and/or directly between rows $R_3$ and $R_6$. In embodiments, rows $R_4$ and $R_5$ may both be configured with the same or similar electrical component arrangement. Certain rows (e.g., row $R_4$ and/or row $R_5$), which may be disposed adjacent to each other, may include a plurality of large electrical components (e.g., components $40_{20}$, $40_{21}$, $40_{24}$-$40_{27}$, $40_{30}$, $40_{31}$) and a plurality of small electrical components (e.g., components $40_{22}$, $40_{23}$, $40_{28}$, $40_{29}$). In embodiments, large electrical components may be disposed at opposite sides of circuit board 20 and small electrical components may be disposed between the large electrical components.

Figure 2A:
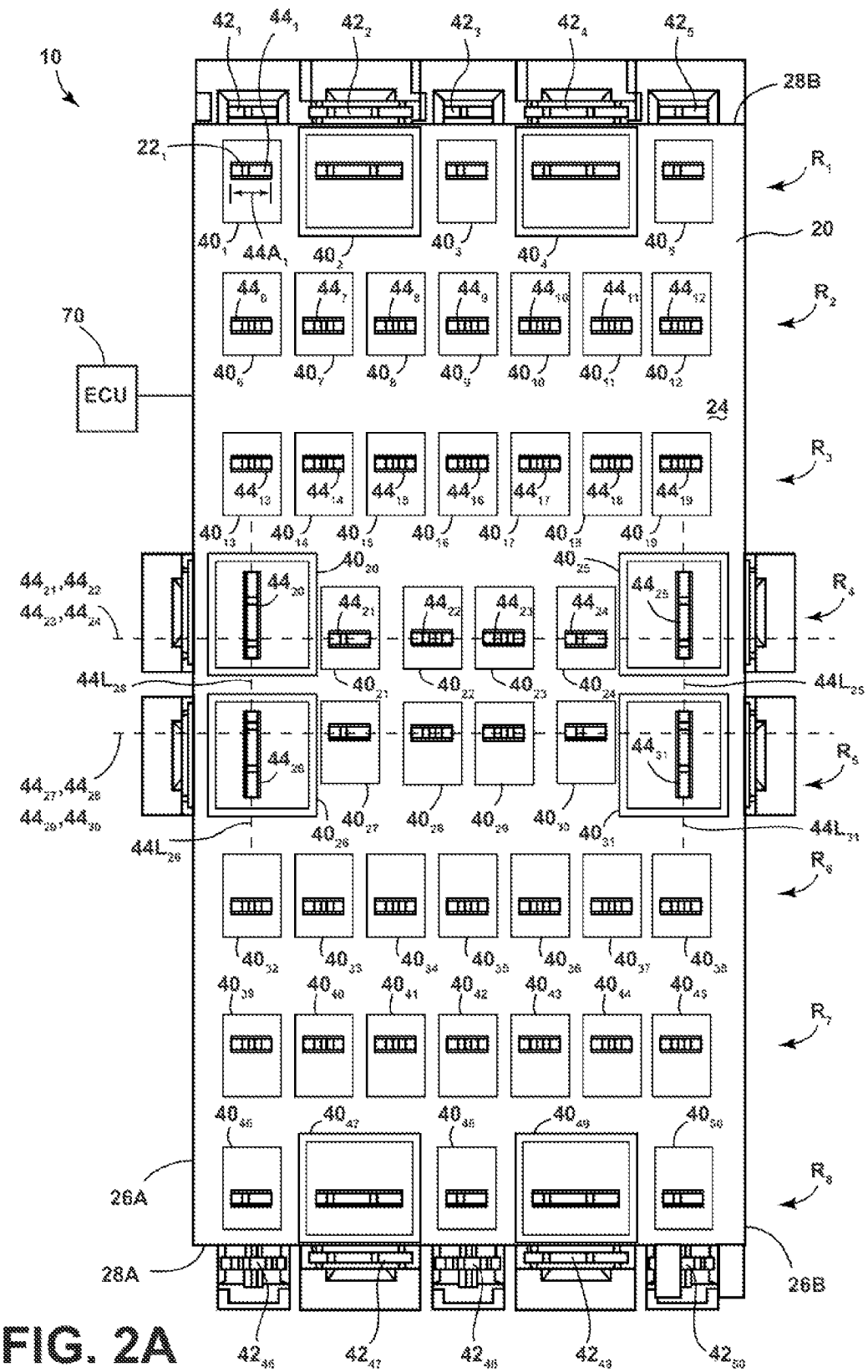
FIG. 2A is a bottom view of portions of an embodiment of a circuit board assembly of a power distribution box in accordance with teachings of the present disclosure.
Figure 2B:
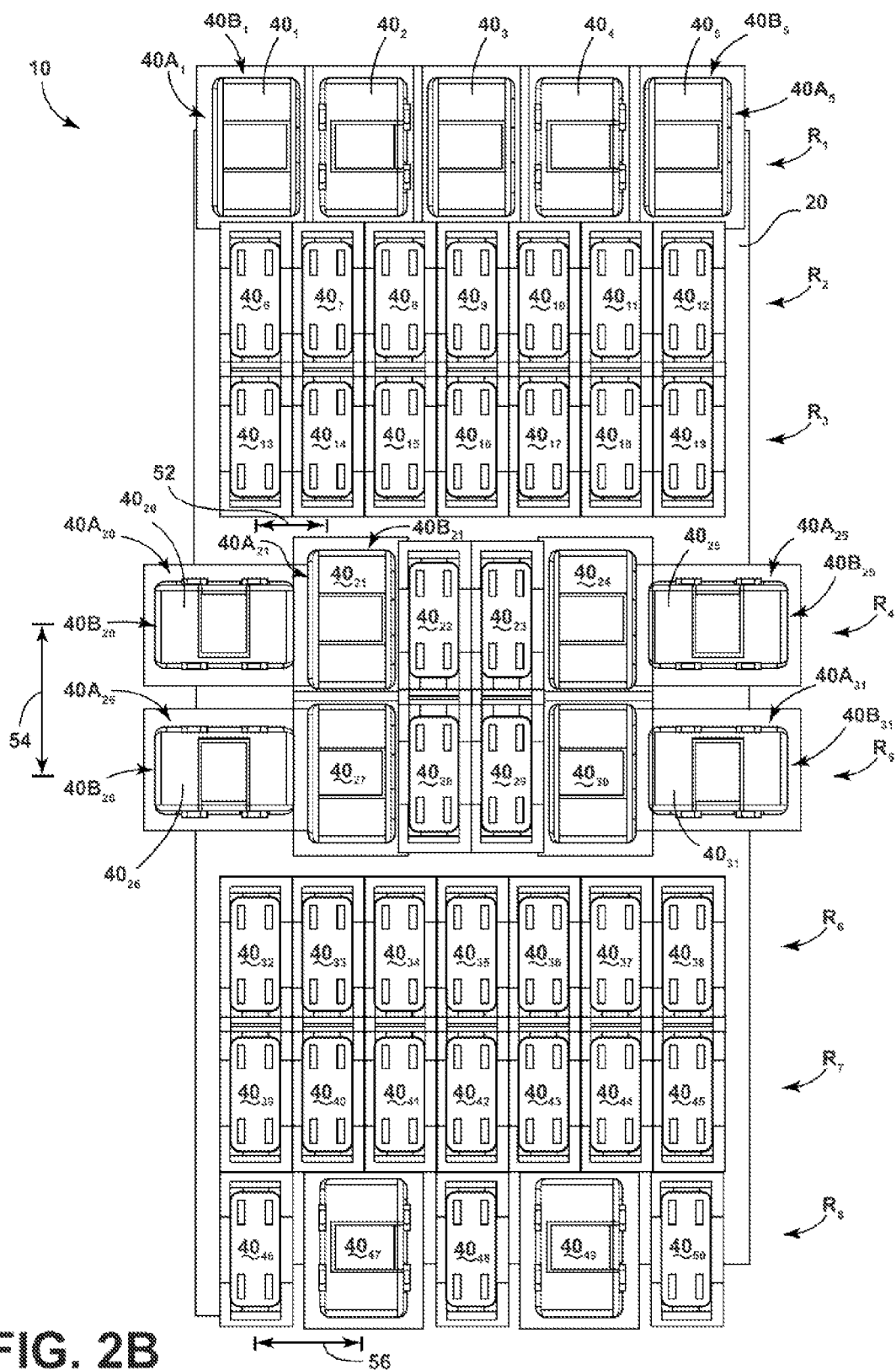
FIG. 2B is a top view of a portion of an embodiment of a circuit board assembly of a power distribution box in accordance with teachings of the present disclosure.
Figure 2C:
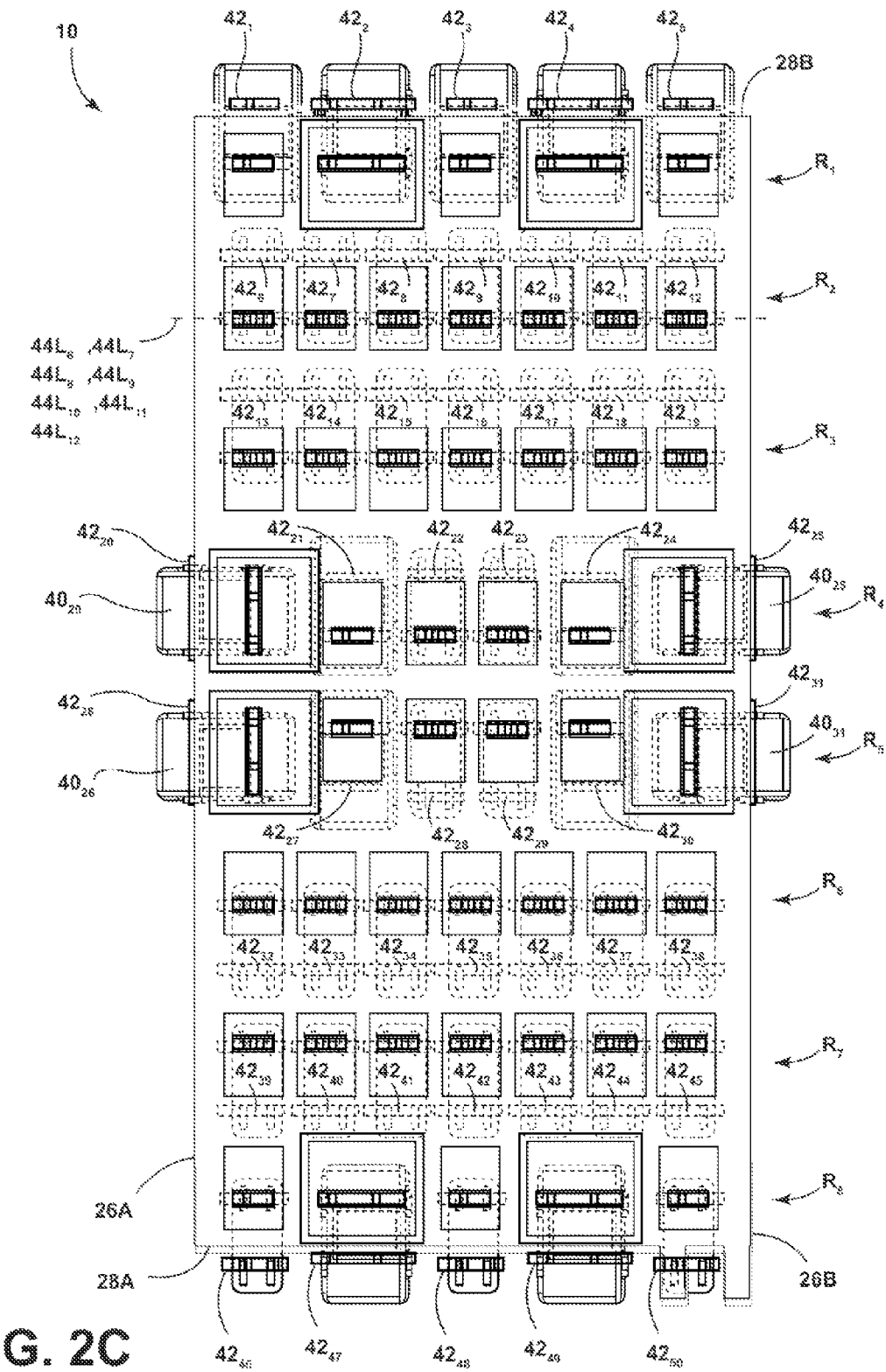
FIG. 2C is a superimposed bottom view of a portion of an embodiment of a power distribution box in accordance with teachings of the present disclosure.

In embodiments, such as generally illustrated in FIGS. 2A and 2C, a first set of large electrical components (e.g., components $40_{20}$, $40_{25}$, $40_{26}$, $40_{31}$) may be disposed at or near edges of circuit board (e.g., edges 26A, 26B, 28A, 28B). In embodiments, longitudinal axes $44L_{20}$, $44L_{25}$, $44L_{26}$, $44L_{31}$, $44L_{31}$ of second terminals $44_{20}$, $44_{25}$, $44_{26}$, $44_{31}$ of the first set of large electrical components may be disposed parallel to long edge 26 of circuit board 20.

In embodiments, such as generally illustrated in FIG. 2B, certain large electrical components (e.g., components $40_{20}$ and $40_{26}$) may be disposed at a relatively small distance from each other. For example, and without limitation, a distance 54 between center lines of components $40_{20}$ and $40_{26}$ (and/or between components $40_{25}$ and $40_{31}$) may be about 11.20 mm or less.

In embodiments, a second set of large electrical components e.g., components $40_{21}$, $40_{24}$, $40_{27}$, $40_{30}$) may be disposed adjacent to and/or inside of the first set of electrical components. Longitudinal axes $44L_{21}$, $44L_{24}$, $44L_{27}$, $44L_{30}$ of second terminals $44_{21}$, $44_{24}$, $44_{27}$, $44_{30}$ of the second set of electrical components may be disposed perpendicular to long edge 26 of circuit board 20, which may include being disposed generally perpendicular to second terminals $44_{20}$, $44_{25}$, $44_{26}$, $44_{31}$ of the first set of large electrical components. In embodiments, the first set of large electrical components may be disposed perpendicular to the second set of large electrical components (e.g., long side $40A_{20}$ of component $40_{20}$ may be perpendicular to long side $40A_{21}$ of component $40_{21}$).

In embodiments, longitudinal axes $44L_N$ (e.g., axes $44L_6$, $44L_7$, $44L_8$ $44L_9$, $44L_{10}$, $44L_{11}$, $44L_{12}$) of second terminals $44_N$ of some or all small electrical components $40_N$ may be disposed perpendicular to long edge 26 of circuit board 20.

In embodiments, one or more rows (e.g., row $R_4$) may include small electrical components $40_{22}$, $40_{23}$ disposed between large electrical components $40_{21}$, $40_{24}$, which may be disposed between large electrical components $40_{20}$, $40_{25}$. In embodiments, row $R_5$ may include small electrical components $40_{28}$, $40_{29}$ disposed between large electrical components $40_{27}$, $40_{30}$, which may be disposed between large electrical components $40_{26}$, $40_{31}$. In embodiments, such as generally illustrated in FIGS. 1 and 3, one or more electrical components $40_N$ may be disposed such that at least a portion of each may extend beyond an outer perimeter of circuit board 20, which may include at least a portion of first terminal $42_N$ of the electrical component being disposed outside the perimeter of circuit board 20, and a second terminal $44_N$ disposed through an aperture $22_N$ in circuit board 20 (e.g., for connection with electrical connector 60). For example, and without limitation, each electrical component $40_N$ in rows $R_1$ and $R_8$ may be disposed such that first terminals $42_1$, $42_2$, $42_3$, $42_4$, $42_5$ of components $40_1$, $40_2$, $40_3$, $40_4$, $40_5$, and/or first terminals $42_{46}$, $42_{47}$, $42_{48}$, $42_{49}$, $42_{50}$ of components $40_{46}$, $40_{47}$, $40_{48}$, $40_{49}$, $40_{50}$ may be disposed entirely outside the perimeter of circuit board 20. In embodiments, first terminals $42_{20}$, $42_{25}$, $42_{26}$, $42_{31}$ of components $40_{20}$, $40_{25}$, $40_{26}$, $40_{31}$ may be disposed at least partially outside the perimeter of circuit board.

Figure 9:
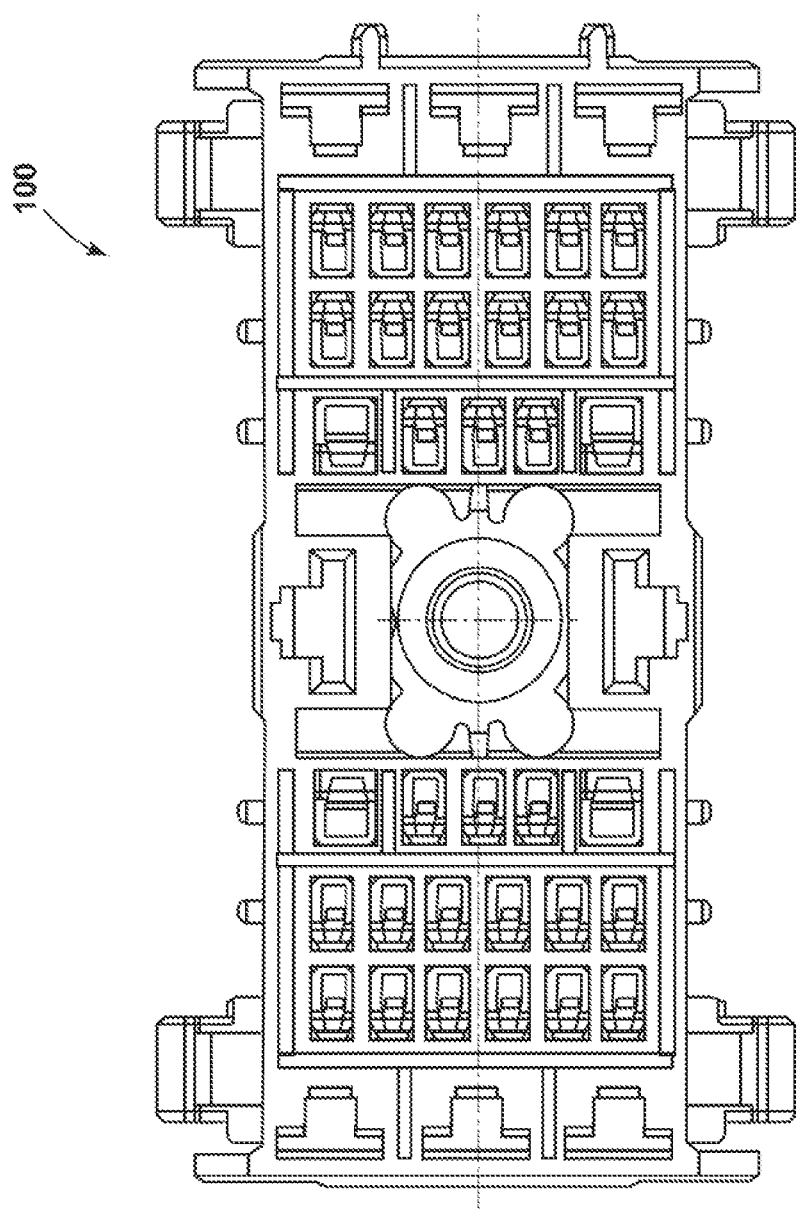
FIG. 9 is a top view of a conventional power distribution box.

An arrangement that includes electrical components $40_N$ disposed perpendicularly to each other, particularly within the same row and/or column, may be somewhat counterintuitive with respect to conventional designs (see, e.g., conventional design 100 in FIG. 9). For example, and without limitation, disposing electrical components $40_N$ perpendicular to each other (e.g., with respective terminals $42_N$, $44_N$ perpendicular to each other) may typically be assumed to increase a minimum surface area of circuit board 20, which could be considered undesirable. However, such an arrangement may reduce an amount of electrical traces 50 for connecting the electrical components $40_N$, and/or the benefits of such reduction may limit and/or outweigh undesirable effects (e.g., increased surface area), if any. For example, and without limitation, reducing an amount of traces 50 may reduce costs, complexity, and/or may reduce a minimum surface area of circuit board 20 to accommodate electrical components $40_N$ and traces 50.

In embodiments, after circuit board 20 has been designed (e.g., with a trace minimizing electrical component $40_N$ arrangement) and/or assembled, a wiring harness connector 60 may be designed and/or manufactured. In embodiments, such as generally illustrated in FIGS. 4B-7, a wiring harness connector 60 may include a housing 66. In embodiments, wiring harness connector 60 may be manufactured to include one or more connector terminals $62_N$ that may be configured for electrical connection with first terminals $42_N$ and/or second terminals $44_N$ of electrical components $40_N$. An arrangement of connector terminals $62_N$ may generally correspond to (e.g., may be a mirror image of) some or all of a trace minimizing electrical component arrangement, which may include being arranged in a plurality of rows $CR_N$. For example, and without limitation, connector rows $CR_1$, $CR_2$, $CR_3$, $CR_4$, $CR_5$, $CR_6$, $CR_7$, $CR_8$ and the electrical terminals therein (e.g., terminals $62_1$-$62_{50}$) may correspond to and/or be configured for electrical connection with electrical components $40_1$-$40_{50}$ in rows $R_1$, $R_2$, $R_3$, $R_4$, $R_5$, $R_6$, $R_7$, $R_8$ of circuit board 20 and the second terminals $44_N$ thereof (e.g., second terminals $44_1$-$44_{50}$), respectively.

In embodiments, at least one connector terminal (e.g., terminal 64) may be configured for an electrical connection with an electrical component that is not attached to circuit board 20 and/or that is not part of a trace minimizing electrical component arrangement. In embodiments, such an electrical component that is not attached to circuit board 20 and/or that is not part of a trace minimizing electrical component arrangement may include a power source, such as, for example, a vehicle battery 80.

In embodiments, a method of manufacturing an electrical connector 60 may comprise determining a footprint (e.g., physical dimensions) and/or layout of a conventional circuit board, which may include determining a conventional total amount of traces 50 that electrically connect a plurality of electrical components $40_N$. The method may include determining a circuit board layout that minimizes a total amount of electrical traces 50. The minimized amount of traces 50 may be determined according to the same circuit board footprint as the conventional circuit board and the minimized amount be less than the conventional total amount of traces (e.g., a lesser total amount of traces for the same size circuit board or, potentially, a smaller circuit board). The method may include designing a layout for terminals of the electrical connector 60 according to the determined circuit board layout and/or manufacturing, the electrical connector 60 according to the designed layout.

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

Although only certain embodiments have been described above with a degree of particularity, those skilled in the art could make numerous alterations to the disclosed embodiments without departing from the scope of this disclosure. Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. It is intended that all matter contained in the above description or shown in the accompanying drawings shall be interpreted as illustrative only and not limiting. Changes in detail or structure may be made without departing from the present disclosure as defined in the appended claims.

What is claimed is:

1. A power distribution box assembly, comprising:
   a circuit board;
   a plurality of electrical components attached to the circuit board, at least one of the plurality of electrical components having a current rating of at least 60 amps; and
   a plurality of electrical traces attached to the circuit board and configured for providing an electrical connection to the plurality of electrical components,
   wherein an electrical component of the plurality of electrical components includes a first terminal extending into the circuit board and a second terminal that does not extend in to the circuit board.

2. The power distribution box assembly of claim 1, wherein the plurality of electrical components includes a first electrical component having a first center line and a second electrical component having a second center line, wherein the first center line and the second center line are separated by a distance of 11.2 mm or less and the first electrical component is smaller than the second electrical component.

3. The power distribution box assembly of claim 2, wherein the plurality of electrical components includes a third electrical component having a third center line and a fourth electrical component having a fourth center line; the third center line and the fourth center line are separated by a distance 5.5 mm or less; and, the first electrical component and the second electrical component are larger than both of the third electrical component and the fourth electrical component.

4. The power distribution box assembly of claim 1, wherein the plurality of electrical components are disposed relative to the circuit board such that at least one of a number, a length, and a volume of the electrical traces is minimized.

5. A power distribution box assembly, comprising:
   a circuit board;
   a plurality of electrical components attached to the circuit board, at least some of the electrical components including current ratings of at least 60 amps; and
   a plurality of electrical traces attached to the circuit board and configured for providing an electrical connection to the plurality of electrical components,
   wherein the plurality of electrical components includes a first set of electrical components and a second set of electrical components, and the first set of electrical components is attached to the circuit board such that a longest side of each electrical component of the first set of electrical components is parallel to a shortest side of the circuit board.

6. The power distribution box assembly of claim 5, comprising a wiring harness connector including a plurality of connector terminals configured for electrical connection with the plurality of electrical components; wherein each the plurality of electrical components includes a plurality of electrical component terminals, and at least one of the electrical component terminals extends through the circuit board and is connected to a corresponding connector terminal of the wiring harness connector.

7. The power distribution box assembly of claim 5, wherein the second set of electrical components is attached to the circuit board such that a shortest side of each electrical component of the second set of electrical components is perpendicular to a longest edge of the circuit board.

8. The power distribution box assembly of claim 6, wherein the plurality of electrical components are attached to the circuit board in a plurality of rows and at least one row includes a first electrical component from the first set of electrical components and a second electrical component from the second set of electrical components.

9. The power distribution box assembly of claim 7, wherein at least one row includes at least two electrical components of the first set of electrical components and at least two electrical components of the second set of electrical components.

10. The power distribution box assembly of claim 8, wherein the plurality of rows includes at least eight rows, and at least three of the plurality of rows include different numbers of electrical components.

11. A method of manufacturing an electrical connector, the method comprising:
    determining a circuit board layout for a circuit board having electrical traces that electrically connect a plurality of electrical components;
    designing a layout for components of the electrical connector according to the determined circuit board layout; and
    manufacturing the electrical connector according to the designed layout.

12. The method of claim 11, wherein the electrical connector is a wiring harness connector of a wiring harness, and wherein determining the circuit board layout comprises:
    determining a maximum surface area of the circuit board; and
    determining a set of electrical components to be attached to the circuit board.

13. The method of claim 11, wherein determining the circuit board layout comprises iteratively arranging the plurality of electrical components relative to the circuit board.

14. The method of claim 13, wherein iteratively arranging the plurality of electrical components is conducted via a computer simulation of the circuit board and the electrical components.

15. The method of claim 11, wherein the plurality of electrical components includes a first electrical component and a second electrical component; and, the determined circuit board layout includes the first electrical component and the second electrical component being disposed such that respective center lines of the first electrical component and the second electrical component are separated by distance of 11.2 mm or less.

16. The method of claim 15, wherein the plurality of electrical components includes a third electrical component and a fourth electrical component; the determined circuit board layout includes the third electrical component and the fourth electrical component being disposed such that respective center lines of the third electrical component and the fourth electrical component are separated by a distance of 5.5 mm or less; and, the first electrical component and the second electrical component are larger than both of the third electrical component and the fourth electrical component.

17. The method of claim 11, comprising assembling the circuit board and the electrical components according to the determined circuit board layout, and connecting the electrical connector with the assembled electrical components.

18. The method of claim 11, wherein the determined circuit board layout comprises at least one electrical component of the plurality of electrical components being disposed with a first electrical terminal attached to the circuit board and a second electrical terminal not attached to the circuit board, and the second electrical terminal is disposed laterally outside of a perimeter of the circuit board.

19. The method of claim 11, wherein the determined circuit board layout comprises each electrical component of the plurality of electrical components having a first electrical terminal extending through the circuit board for connection with the electrical connector and a second electrical terminal that does not extend through the circuit board.

20. The method of claim 11, wherein the plurality of electrical components includes a first set of electrical components and a second set of electrical components; the determined circuit board layout includes the first set of electrical components being attached to the circuit board such that a longest side of each electrical component of the first set of electrical components is perpendicular to a longest edge of the circuit board; the determined circuit board layout includes the second set of electrical components being attached to the circuit board such that a longest side of each electrical component of the second set of electrical components is parallel to the longest edge of the circuit board; the determined circuit board layout includes the plurality of electrical components being attached to the circuit board in a plurality of rows; at least one of the plurality of rows includes a first electrical component from the first set of electrical components and a second electrical component from the second set of electrical components.

* * * * *